United States Patent
Snoeij et al.

(10) Patent No.: US 9,291,648 B2
(45) Date of Patent: Mar. 22, 2016

(54) HYBRID CLOSED-LOOP/OPEN-LOOP MAGNETIC CURRENT SENSOR

(71) Applicant: Texas Instruments Deutschland GmbH, Freising (DE)

(72) Inventors: Martijn Fridus Snoeij, Erding (DE); Viola Schäffer, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 95 days.

(21) Appl. No.: 14/193,023

(22) Filed: Feb. 28, 2014

(65) Prior Publication Data
US 2015/0042325 A1  Feb. 12, 2015

Related U.S. Application Data

(60) Provisional application No. 61/863,294, filed on Aug. 7, 2013.

(51) Int. Cl.
*G01R 33/07* (2006.01)
*G01R 19/00* (2006.01)
*G01R 15/18* (2006.01)

(52) U.S. Cl.
CPC .................................. *G01R 15/185* (2013.01)

(58) Field of Classification Search
CPC ....... G01R 15/185; G01R 19/00; G01R 33/07
USPC ................................................. 324/117–128
See application file for complete search history.

(56) References Cited

U.S. PATENT DOCUMENTS

| 3,571,700 | A  | 3/1971  | Paine et al. |
| 4,782,377 | A  | 11/1988 | Mahan |
| 4,929,993 | A  | 5/1990  | Popovic |
| 4,987,467 | A  | 1/1991  | Popovic |
| 5,548,151 | A  | 8/1996  | Funaki et al. |
| 5,572,058 | A  | 11/1996 | Biard |
| 6,160,697 | A  | 12/2000 | Edel |
| 6,278,272 | B1 | 8/2001  | Scarzello et al. |
| 7,208,947 | B2 | 4/2007  | Park et al. |
| 7,212,001 | B2 | 5/2007  | Choi et al |

(Continued)

FOREIGN PATENT DOCUMENTS

DE  10204424 C1  9/2003

OTHER PUBLICATIONS

Bazzocchi, et al. "Interference rejection algorithm for current measurement using magnetic sensor arrays", Sensors and Actuators 85 (2000), pp. 38-41.

(Continued)

*Primary Examiner* — Jay Patidar
(74) *Attorney, Agent, or Firm* — Gregory J. Albin; Frank D. Cimino

(57) ABSTRACT

Hybrid magnetic current sensors and sensing apparatus are presented with closed-loop and open-loop circuitry employs first and second integrated magnetic sensors to sense a magnetic field in a magnetic core structure gap to provide high accuracy current measurement via a closed-loop magnetic circuit with the first sensor in a nominal current range as well as open-loop current measurement using the second sensor in an extended second range to accommodate over-current conditions in a host system as well as to provide redundant current sensing functionality.

18 Claims, 6 Drawing Sheets

(56) References Cited

U.S. PATENT DOCUMENTS

| | | | |
|---|---|---|---|
| 7,298,141 B2 | 11/2007 | Bartington | |
| 7,391,210 B2 | 6/2008 | Zhang et al. | |
| 7,391,211 B2 | 6/2008 | Cripe | |
| 7,407,596 B2 | 8/2008 | Choi et al. | |
| 8,093,891 B2 | 1/2012 | Rocznik et al. | |
| 8,339,133 B2 | 12/2012 | Teppan | |
| 2002/0149356 A1* | 10/2002 | Wenger ............... | G01R 19/0092 324/117 R |
| 2006/0157809 A1 | 7/2006 | Alimi et al. | |

OTHER PUBLICATIONS

Dezuari, et al. "Printed circuit board integrated fluxgate sensor", Sensors and Actuators 81 (2000), pp. 200-203.
Tang, et al. "Excitation circuit for fluxgate sensor using saturable inductor", Sensors and Actuators A 113 (2004), pp. 156-165.
Drljaca, et al., "Low-Power 2D Fully Integrated CMOS Fluxgate Magnetometer", IEEE Sensors Journal, vol. 5, No. 5, Oct. 2005, pp. 909-915.
Drljaca et al., "Single Core Fully Integrated CMOS Micro-Fluxgate Magnetometer", Elsevier B.V., Science Direct, Sensors and Actuators A 110 (2004) (Accepted Sep. 15, 2003) pp. 236-241.
Chiesi, et al., "CMOS Planar 2D Micro-Fluxgate Sensor", 2000 Elsevier Science S.A., Sensors and Actuators 82 (2000) (Accepted Nov. 10, 1999), pp. 174-180.
Kawahito, et al., "A 2-D CMOS Microfluxgate Sensor System for Digital Detection of Weak Magnetic Fields", IEEE Journal of Solid-State Circuits, vol. 34, No. 12, Dec. 1999, pp. 1843-1851.
Ripka, et al. "Pulse Excitation of Micro-Fluxgate Sensors", IEEE Transactions on Magnetics, vol. 37, No. 4, Jul. 2001, pp. 1998-2000.
Choi et al., "The Microfluxgate Magnetic Sensor Having Closed Magnetic Path", IEEE Sensors Journal, vol. 4, No. 6, Dec. 2004, pp. 768-771.
"Sensor Signal Conditioning IC for Closed-Loop Magnetic Current Sensor", Texas Intruments, DRV401, SBVS070B—Jun. 2006, Revised May 2009, 36 pgs.
"Sensor Signal Conditioning IC for Closed-Loop Magnetic Current Sensors", Texas Instruments, DRV411, SBOS693B, Aug. 2013, Revised Dec. 2013, 34 pgs.
Melexis, Microelectronic Integrated Systems, Application Note, MLX91207 Programmable Current Sensor, Sep. 2011, pp. 1-20.
Baschirotto et al., "An Integrated Micro-Fluxgate Magnetic Sensor With Front-End Circuitry", IEEE Transactions on Instrumentation and Measurement, vol. 58, No. 9, Sep. 2009, pp. 3269-3275.
Baschirotto et al., "A 2D Micro-Fluxgate Earth Magnetic Field Measurement Systems With Fully Automated Acquisition Setup", Elsevier, ScienceDirect, Measurement 43 (2010) pp. 46-53.
Baschirotto et al., "Fluxgate Magnetic Sensor in PCB Technology", IEEE, Instrumentation and Measurement Technology Conference, Como, Italy, May 18-20, 2004, pp. 808-812.

\* cited by examiner

HYBRID CLOSED-LOOP/OPEN-LOOP MAGNETIC CURRENT SENSOR

This application claims priority to and the benefit of U.S. Provisional Patent Application Ser. No. 61/863,294 that was filed on Aug. 7, 2013 and is entitled HYBRID CLOSED-LOOP/OPEN-LOOP MAGNETIC CURRENT SENSOR, the entirety of which is incorporated by reference herein.

FIELD OF THE INVENTION

The present disclosure relates to current sensors and more particularly to closed-loop non-contacting current sensing systems.

BACKGROUND

Contactless current sensing is employed in a variety of applications for safely measuring current flow, particularly for high current levels. Open-loop current sensing provides a cost effective solution in which a magnetic field generated by the flow of current through an electrical conductor is concentrated inside a magnetic core and a magnetic sensor measures the field and provides an output signal used for estimating the current flow. Open-loop approaches typically consume little power, and can use low sensitivity sensors for measuring high currents. However, the open-loop approach suffers from poor accuracy, typically due to nonlinearities of the core and/or the sensor. Closed-loop current sensing techniques may be employed with a magnetic core encircling an electrical conductor, where a secondary winding or compensation coil is provided on the core and driven by the sensor until the magnetic flux within the core is zero. The secondary current at this point is measured and is generally proportional to the primary current flowing in the electrical conductor of interest. The closed-loop approach generally provides improved accuracy compared with open-loop techniques, and is thus preferred in applications using the current measurement for regulation of host system performance or for power metering applications. However, closed-loop current sensing is generally restricted to the capabilities of the compensation coil driver circuitry, and accommodating a high sensed current range is expensive and consumes a significant amount of power. Thus, close-loop techniques are not economical for certain high current sensing applications, while open-loop techniques may not provide the required level of accuracy in current sensing at nominal or expected current levels. Moreover, certain current sensing applications require redundancy and/or self-test capabilities to ensure correct measurement, but provision of two or more current sensors in parallel significantly impacts cost and system complexity, as well as occupying more space in a host system. Accordingly, a need remains for improved current sensing systems and apparatus.

SUMMARY

Hybrid closed-loop/open-loop techniques and apparatus are provided for non-contact current measurement by which the foregoing and other shortcomings can be mitigated or overcome. Integrated dual-sensor apparatus embodiments are disclosed to facilitate current measurement in situations where good accuracy is required over a nominal current range and significantly higher current levels can be measured with reduced accuracy requirements without significant cost and size impact, by providing the accuracy benefits of closed-loop current sensing techniques in combination with an open-loop sensor to accommodate some measure of current sensing during system overload conditions. Moreover, disclosed embodiments may be employed to facilitate enhanced system integrity and self-testing by redundant current sensing capability.

Hybrid closed-loop, open-loop magnetic current sensor apparatus is provided in certain embodiments, including an integrated circuit having first and second current sensing circuits formed as part of the integrated circuit structure. A first current sensing circuit includes a first magnetic sensor along with a driver circuit to provide a compensation signal at least partially according to the first magnetic sensor output signal in a closed-loop magnetic circuit to drive a compensation coil associated with a core structure magnetically affected by measured current flowing in a conductor. The first current sensing circuitry, moreover, includes a compensation sensing circuit providing a first current sensor signal at least partially according to the compensation signal from the driver circuit. The apparatus further includes a second current sensing circuit with a second magnetic sensor formed as part of the integrated circuit structure, which provides a second current sensor signal, and an output circuit providing an output signal representing the current flowing in the conductor at least partially according to the first current sensor signal and/or the second current sensor signal.

In certain embodiments, the first magnetic sensor employed in the closed-loop magnetic circuit is a fluxgate sensor with corresponding excitation and sensing circuitry, and the second magnetic sensor can be a Hall sensor, such as a vertical Hall sensor in various embodiments. The driver circuit in certain embodiments provides a compensation signal in a first mode at a level representing the current flowing in the conductor to regulate the closed-loop magnetic circuit to a constant flux level over all or at least a portion of a first current range, and the driver may discontinue the compensation signal or provide compensation at a constant level in a second mode over a second current range in various embodiments. The output circuit in certain embodiments provides separate first and second outputs signals respectively representing the first and second current sensor signals, or may provide one output signal based on the first current sensor signal over the first current range and provide the output signal based on the second current sensor signal over at least a portion of the second range. In various embodiments, moreover, the output circuit provides an output signal as a sum or other function of the first current sensor signal and the second current sensor signal, through analog circuitry and/or through operations on converted digital values based on the current sensor signals. Certain embodiments include a logic circuit comparing one or both of the first magnetic sensor output signal and the second current sensor signal with a corresponding threshold, and the logic circuit controls the output circuit in a first state to provide the output signal or signals based on the first current sensor signal when the compared signal is below the threshold, and in a second state to provide the output signal at least partially according to the second current sensor signal when the compared signal is greater than or equal to the corresponding threshold.

A current sensing apparatus is provided in accordance with further aspects of the disclosure, including a first current sensing circuit with a fluxgate sensor circuit providing a first magnetic sensor output signal according to a magnetic field, a driver circuit providing a compensation signal in a closed-loop magnetic circuit at least partially according to the first magnetic sensor output signal, and a compensation sensing circuit which provides a first current sensor signal at least partially according to the compensation signal from the driver circuit. The apparatus further includes a Hall sensor providing a second current sensor signal at least in part according to the magnetic field, as well as an output circuit that provides one or more output signals according to the first current sensor signal over at least a portion of a first current range and according to the second current sensor signal over a second current range.

A hybrid closed-loop, open-loop magnetic current sensor is provided in accordance with further aspects of the present disclosure, which includes a magnetically susceptible core structure accommodating an electrical conductor, a compensation coil with at least one winding around the core, and an integrated circuit with means for testing current flow in the conductor using a closed-loop magnetic circuit comprising a fluxgate sensor formed on or in the integrated circuit, as well as means for testing the current flow using an open-loop magnetic circuit with a Hall sensor formed on or in the integrated circuit.

DESCRIPTION OF THE VIEWS OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
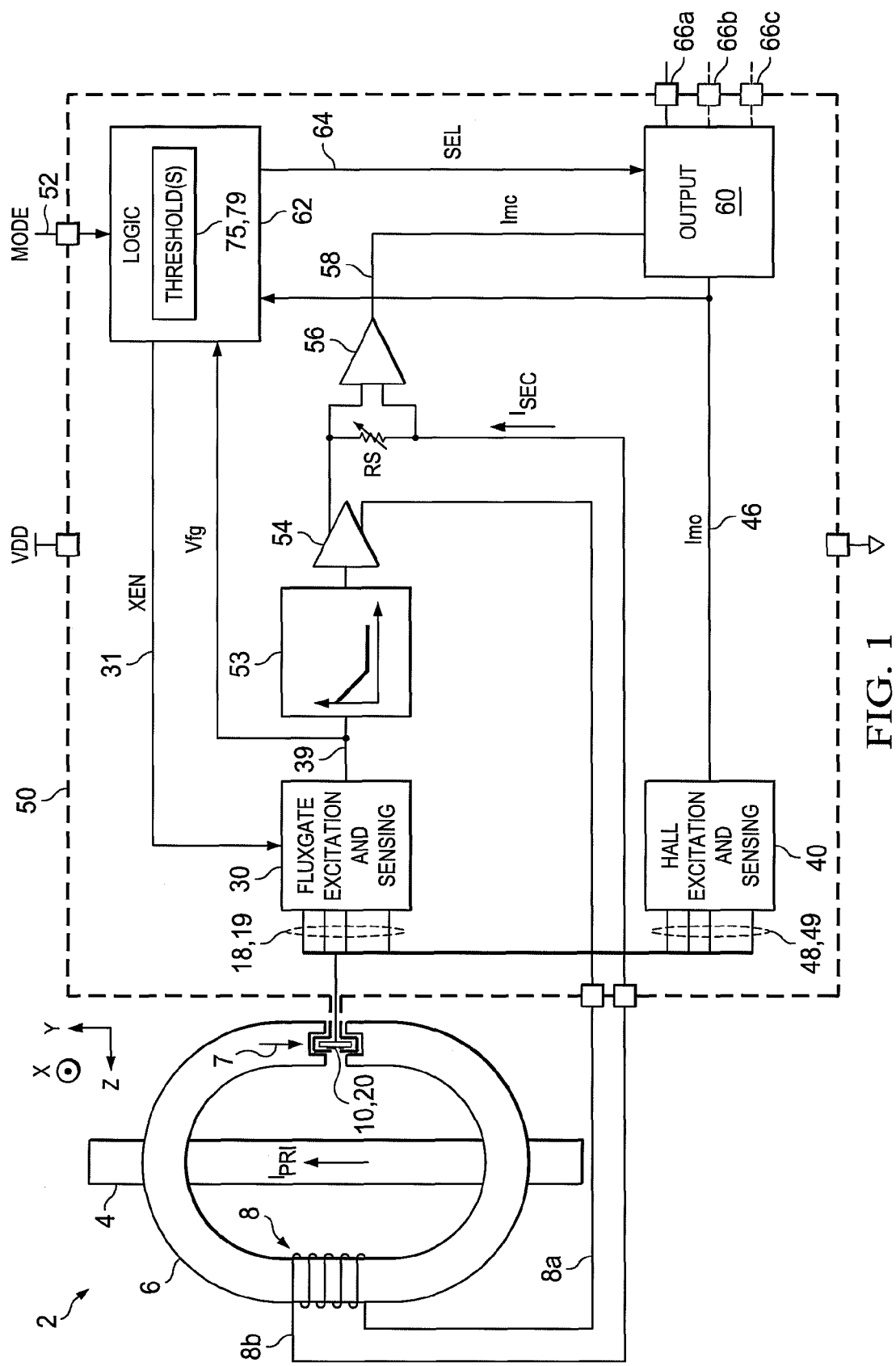
FIG. 1 is a schematic diagram illustrating an exemplary hybrid current sensing system with two magnetic sensors integrated into a single integrated circuit disposed within a magnetic core gap for closed-loop, open-loop current sensing according to one or more embodiments.

One or more embodiments or implementations are hereinafter described in conjunction with the drawings, wherein like reference numerals are used for reference to like elements throughout, and wherein the various features are not necessarily drawn to scale.

Figure 2:
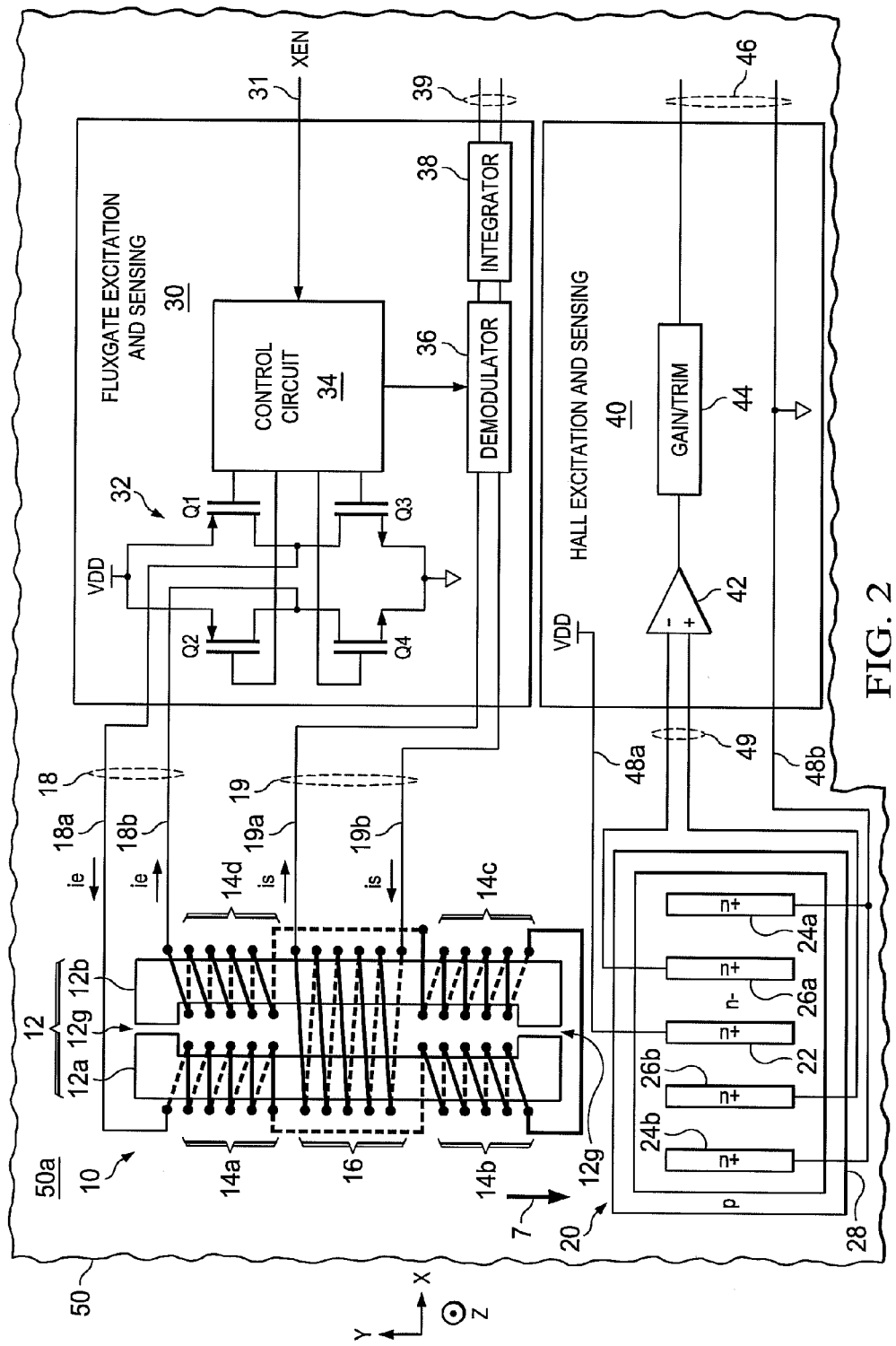
FIG. 2 is a schematic diagram illustrating further details of the integrated magnetic sensors and associated excitation and sensing circuitry according to one or more embodiments.
Figure 3:
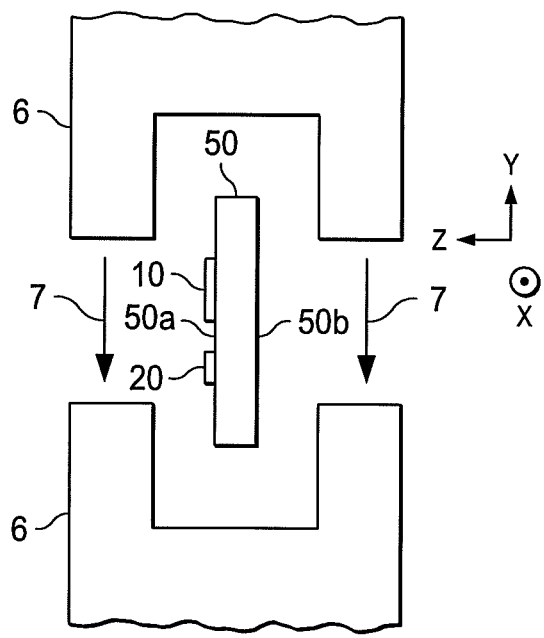
FIG. 3 is a partial front elevation view illustrating positioning of the first and second magnetic sensors and a portion of a corresponding integrated circuit within a gap of the magnetic core in the current sensor system of FIGS. 1 and 2.

Referring to FIGS. 1-3, an exemplary integrated closed-loop/open-loop current sensor apparatus 2 is shown in FIG. 1 for measuring a primary current $I_{PRI}$ flowing in a primary coil or conductor 4 magnetically interacting with a magnetic core 6. The conductor 4 can be magnetically interfaced with the core 6 in any suitable fashion by which the core structure 6 is magnetically affected by the current flow $I_{PRI}$ in the conductor 4, and the conductor 4 may be a single electrical conductor passing through the core 6 as shown in FIG. 1, or can be a winding with one or more turns encircling portions of the core 6, or other suitable magnetic interaction configuration by which the current $I_{PRI}$ flowing in the conductor 4 affects the magnetic flux in the core 6. Multiple primary conductors 4 may be used in certain embodiments, for example, in ground fault sensing applications with a primary conductor 4 passing through the opening in the core 6 to direct current toward a circuit of a host system, and a return conductor 4 (not shown) providing a return current path from the powered circuit and extending through the core opening in the opposite direction, with the sensing apparatus 2 being used to monitor the net current flow (ideally 0) and to detect or identify fault conditions when the net current flow in the two primary conductors 4 deviates from zero, thereby indicating a suspected fault condition in the host system circuit. Multiple primary conductors 4 may also be used, each passing through the opening of the core structure 6, for monitoring three-phase power systems, and/or to sense a summation of multiple current flows, or in a variety of other applications. Thus, while the illustrated configuration in FIG. 1 shows a single primary conductor 4, the various concepts of the present disclosure are not limited to this exemplary situation. The core structure 6 includes a gap or opening in which first and second magnetic sensors 10 and 20 are disposed, where the magnetic sensors 10 and 20 in certain embodiments are integrated into, or otherwise formed as part of, a single integrated circuit structure 50, which may include sensors 10 and 20 formed on and/or in a semiconductor structure and/or a printed circuit board structure to form a single integrated circuit structure (IC) 50 having both sensors 10 and 20 disposed proximate one another within the gap of the core structure 6. Any suitable magnetic sensors 10 and 20 can be used, including without limitation to fluxgate sensors, Hall effect sensors, etc., which provide one or more signals or values indicative of a magnetic condition of the core 6.

As shown in FIG. 3, the sensors 10 and 20 in certain embodiments are constructed so as to be sensitive, at least partially, to magnetic fields in a vertical direction 7, which may be a direction generally parallel to a first surface or side 50a of the integrated circuit structure 50, with the integrated circuit structure 50 being generally disposed vertically within the core gap in certain non-limiting embodiments. As seen in FIG. 3, moreover, the integrated circuit structure 50 includes first and second opposite sides 50a and 50b, respectively, and the circuit 50 is disposed within a slotted gap in the illustrated core structure 6 with the first side 50a extending in a vertical (Y) direction generally parallel to the direction 7 of magnetic fields within the slotted portion of the core 6. In this embodiment, a first current sensing circuit 10, 30, 53, 54, 56 of FIG. 1 operates in a closed-loop magnetic circuit via the magnetic sensor 10 and a compensation coil 8 having first and second ends 8a and 8b to provide closed-loop current sensing to estimate the current $I_{PRI}$ flowing in the conductor 4. This first current sensing circuitry includes the first magnetic sensor 10, in this case a fluxgate sensor, formed on and/or in the integrated circuit structure 50. The sensor 10 provides a first magnetic sensor output signal 39 via excitation and sensing circuitry 30 according to the magnetic field in the direction 7 generally parallel to the first side 50a of the integrated circuit structure 50 (e.g., in the negative Y direction in the figures).

FIG. 2 illustrates a partial schematic front view showing the top side of the integrated circuit structure 50a with further details of a fluxgate sensor 10 formed on and/or in the integrated circuit structure 50. The sensor 10 in this example includes a fluxgate core structure 12 fabricated on and/or in a semiconductor substrate or printed circuit board structure with suitable excitation and sense coil windings formed as conductive structures at least partially encircling the core structure, and excitation and sensing circuitry 30 includes suitable circuitry for providing excitation AC waveform to one or more excitation coils of the sensor 10 via the connections 18 and 19. The circuit 30 in such embodiments further includes sensing circuitry 36, 38 with any suitable rectification or demodulation circuitry and suitable integrator or other filtering circuits by which an output signal 39 is provided which indicates or otherwise represents the external magnetic field proximate the sensor 10.

As seen in FIG. 2, the fluxgate sensor 10 includes a magnetically susceptible core structure 12, such as may be formed on and/or in the IC structure 50, with an excitation winding or coil 14 including excitation coil sections 14a, 14b, 14c and 14d wound around portions of the core 12, and a centrally located sense winding 16. In the illustrated example, the windings 14 and 16 are formed around corresponding portions of the core structure 12 using conductive portions on different layers of the IC assembly 50, with solid lines showing winding portions above the corresponding core structure 12 and dashed-lines showing winding portions below the corresponding core structure 12. Any number of excitation and sense windings 14, 16 may be used in different embodiments. In certain implementations, for example, the fluxgate core structure 12 may be deposited and patterned as part of the fabrication of a semiconductor-based integrated circuit structure 50, with the windings being fabricated using copper and/or aluminum layer formation and patterning steps. In other possible non-limiting embodiments, the integrated circuit structure 50 includes a printed circuit board substrate, with the core structure 12 being formed on one side of the structure, with windings being constructed using traces on various overlying an underlying layers with suitable vias for conductive interconnection. The illustrated magnetically susceptible core structure 12 includes two longitudinally opposite gaps 12g separating bilaterally symmetrical core portions 12a and 12b. Other designs are possible in which no gap 12g is used, or a single gap may be provided, or more than two such gaps 12g may be included in the core structure 12. Furthermore, the core portions 12a and 12b may, but need not be symmetrical in all embodiments of the present disclosure. In addition, the coil windings in different embodiments can take on many different variations, which in general should not impact the excitation circuitry aspects of the present disclosure, and additional coils can be included on the fluxgate sensor.

An H-bridge excitation circuit 32 provides an AC excitation current signal "ie" 18 to the excitation windings 14 via connections 18a and 18b to the respective first and second ends of the excitation coil 18. Sensing circuitry 36, 38 receives a sensor current signal "is" 19 via connections 19a and 19b to ends of the sense coil 16, and provides the first magnetic sensor output signal 39, such as a voltage signal in one example, based at least partially on the sensor signals 19 received from the sense winding 16. In one non-limiting form of operation, the excitation circuit 32 provides alternating excitation current waveforms "ie" to the excitation windings 18 to alternately drive the core structure 12 through magnetic saturation and demagnetization in opposite polarities or directions, thereby inducing an electrical sense current flow "is" in the sensing coil 16.

The illustrated fluxgate sensor 10 is configured for sensing an external magnetic field generally in the vertical direction 7 (negative Y) direction in FIGS. 1-3, with the fluxgate excitation and sensing circuit 30 including suitable demodulation circuitry 36 and an integrator 38 to provide the output signal 39 representing the magnitude of the external magnetic field proximate the sensor 6. Specifically, when the core structure 12 is exposed to an external magnetic field within the gap of the current sensing core structure 6, the fluxgate core structure 12 is more easily saturated in alignment with that field, and less easily saturated in opposition to the external field. In one possible implementation, the circuitry 30 includes the integrator circuit 38 providing an analog output voltage signal 39 proportional to the sensed magnetic field along the corresponding sensing direction 7 of the fluxgate magnetic sensor 10. Moreover, the sensing circuitry 36 and 38 in certain embodiments is synchronized with the operation of the excitation circuit 32 by one or more control signals from a control circuit 34 which provides switching control signals to H-bridge transistors Q1-Q4 of the excitation circuit 32. As seen in FIG. 2, moreover, the control circuit 34 in certain embodiments can be selectively enabled or disabled via an excitation and enable (XEN) signal 31 from on-board control logic 62 of FIG. 1. The logic circuit 62 may receive an external mode control input signal 52 from a host system in certain embodiments, and may set the enabled/disabled state of the fluxgate excitation accordingly. This feature advantageously allows selective deactivation of the fluxgate excitation circuit 32 in certain modes of operation, for example, when the current $I_{PRI}$ in the conductor 4 is in a second range of operation beyond the nominal first range for which the fluxgate sensor 10 and the closed-loop sensing circuitry 10, 30, 53, 54, 56 is designed or sized.

As best seen in FIG. 1, the first current sensing circuit further includes a driver circuit 54 also formed as part of the IC structure 50, which receives the first magnetic sensor output signal 39 through an integrator/filter circuit 53 providing high DC gain and unity gain at high frequencies, and the driver 54 provides a compensation current signal $I_{SEC}$ in a closed-loop magnetic circuit to drive the compensation coil 8 of the current sensing core 6. Compensation current signal $I_{SEC}$ is generated in the suitable fashion by the driver circuitry 54, and in the illustrated closed-loop current sensing configuration is provided in a manner that regulates the flux within the main core structure 6 to attempt to cancel the flux corresponding to the primary current flow through the conductor 4. A compensation sensing circuit RS, 56 is formed as part of the IC 50 and provides a first current sensor signal 58 at least partially according to the compensation signal $I_{SEC}$ from the driver circuit 54, where the illustrated example provides an amplifier circuit 56 receiving a voltage signal proportional to the compensation current signal $I_{SEC}$ via a sense resistor RS, which may be adjustable or trimmable in certain embodiments as shown. In this manner, the amount of compensation current required to equalize the magnetic flux within the main core structure 6 during regulated closed-loop operation will represent the sensed primary current $I_{PRI}$ flowing in the conductor 4, and the output signal 58 from the compensation sensing circuit amplifier 56 is provided to an output circuit 60 as seen in FIG. 1.

As further shown in FIG. 1, a second current sensing circuit is formed in the integrated circuit structure 50 and includes a second magnetic sensor 20, such as a Hall sensor in non-limiting example, along with an excitation and sensing circuit 40 which provides a second current sensor signal 46 at least partially according to the magnetic field in the first direction 7. As seen in FIG. 2, the Hall excitation and sensing circuitry 40 interfaces with the Hall sensor 20 by connections 48 and 49, with excitation voltage being provided to the sensor 20 by connections 48a and 48b (VDD and a circuit ground in this case), and a Hall voltage output signal is provided to an amplifier 42 via connections 49. In this example, moreover, the circuitry 40 further includes a gain/trim circuit 44 which provides an output voltage as the second current sensor signal 46.

The second sensor 20 operates in open-loop fashion to provide the output signal 46 generally proportional to the sensed magnetic field along the direction 7, and can be any suitable sensor type and form. In the illustrated embodiment, moreover, the second sensor 20 is a vertical Hall structure formed on/in a semiconductor substrate portion of the integrated circuit structure 50 for magnetic sensitivity along the vertical direction (negative Y direction) 7 in FIGS. 1-3. The illustrated design is formed on/in an n− portion of a semiconductor substrate (e.g., silicon), with a p-type ring structure 28 isolating an interior region in which n+ structures 22, 24 and 26 are configured to extend along the sensitivity direction 7. In this case, the vertical Hall configuration provides for connection of the positive excitation voltage via connection 48a to a central n+ structure 22, and a negative excitation connection (ground) is made to the outermost left and right n+ structures 24a and 24b as shown in FIG. 2. By this orientation, magnetic fields in the direction 7 within the gap of the current sensing core structure 6 will create a voltage signal (Hall voltage) between n+ sensing structures 26a and 26b, which are connected to the inputs of the sensing amplifier 42 via the connections 49 as shown in FIG. 2. The output of the amplifier 42 is provided through the gain/trim circuit 44 to generate the second current sensor signal 46 at least partially according to the magnetic field in the direction 7.

Figure 4:
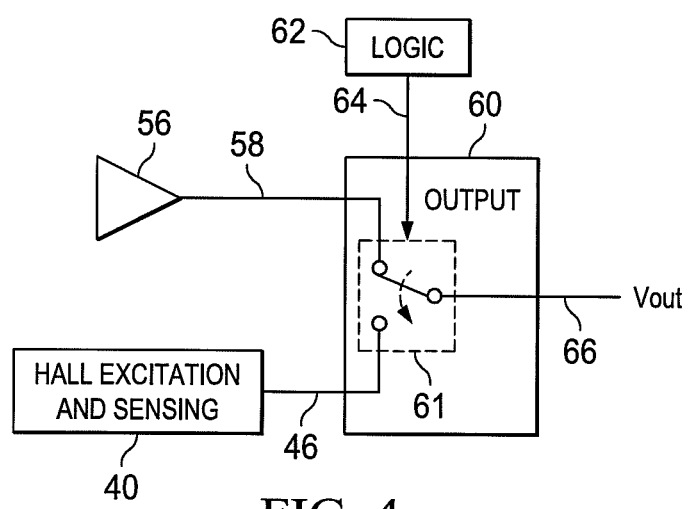
FIG. 4 is a schematic diagram illustrating an exemplary output circuit embodiment in the current sensing system of FIG. 1 providing a voltage output signal corresponding to a selected one of the closed-loop and open-loop sensor circuits.

Referring now to FIGS. 1 and 4-7, the first and second current sensor signals 58 and 46 thus represent an open loop measured current (Imo) and a closed loop measured current (Imc), respectively, and the signals are provided to the output circuit 60 as seen in FIG. 1. The output circuit 60, in turn, provides one or more output signals 66 representing the current $I_{PRI}$ flowing in the conductor 4 at least partially according to one or both of the current sensor signals 58 and 46. In certain embodiments, moreover, the output circuit 60 is operable in different modes according to a mode selection signal (SEL) 64 from the logic circuit 62. FIG. 4 shows one exemplary output circuit embodiment 60, in which a single voltage output signal 66 is provided as an output voltage Vout corresponding to a selected one of the closed-loop and open-loop sensor circuit output signals 58 and 46. In this embodiment, the logic circuit 62 provides the control signal 64 to operate the output circuit in a first mode for a first range of current (e.g., a nominal current range from 0% through 100%) and operates the output circuit 60 in a second mode for a second range of current (e.g., and overcurrent range from 100% through 500% in one non-limiting example). In one possible implementation, the output circuit 60 in this case includes a switch circuit 61 operable according to the mode selection signal 64 from the logic 62 in order to connect the output 66 to the first current sensor signal 58 in the first operating mode, and to connect the output 66 to the second current sensor signal 46 in the second mode.

Figure 5:
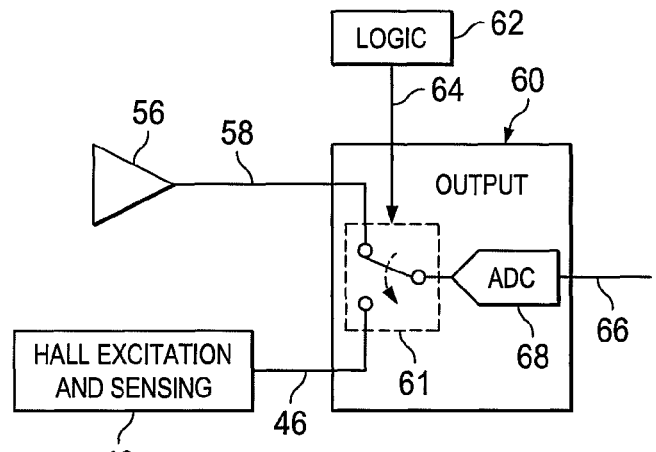
FIG. 5 is a schematic diagram illustrating another output circuit embodiment including an analog-to-digital converter providing a digital output corresponding to a selected one of the closed-loop and open-loop sensor circuits.

FIG. 5 illustrates another embodiment of the output circuitry 60, in this case including an analog-to-digital converter 68 (ADC) with an analog input connectable via the switch 61 to receive the first current sensor voltage signal 58 in a first mode or the second current sensor voltage signal 46 in the second mode, with the logic circuit 62 again operating the switch 61 via the mode selection control signal 64. By this operation in controlling the output circuits 60 of FIGS. 4 and 5, therefore, the logic 62 advantageously provides high accuracy current sensing via the closed-loop magnetic circuit and the closed-loop current sensing configuration using the first sensor 10 and associated excitation and sensing circuitry 30 as well as the driver circuit 54 and the compensation sensing circuitry RS, 56 when the current $I_{PRI}$ flowing in the conductor 4 is in its normal expected operating range (the first range).

For operation at higher current levels (e.g., 100%-500%), the logic 62 changes the state of the switch 61 via the control signal 64 to instead employ the Hall sensor 20 and associated sensing circuitry 40 to provide the output 66 via signal 46, thereby extending the effect of operating range of the overall sensing apparatus 2, possibly with reduced accuracy. It is noted, however, that the provision of the second sensor 10 and associated circuitry 40 is a relatively small increase in the overall size, cost and complexity of the system 2 compared with potentially over designing the size and power consumption of the closed-loop sensing apparatus including a fluxgate sensor 10, circuitry 30 and the compensation driver circuitry 54 in order to provide such extended sensing range. Also, the disclosed approach is significantly smaller and more economical and efficient than providing two separate sensor circuits. Consequently, the integrated closed-loop/open-loop hybrid apparatus 2 of the present disclosure presents a significant advance in non-contacting current sensing, particularly for applications in which a host system is normally expected to operate in a predefined nominal range, with the possibility of higher current operation for which some measure of current sensing capability is desired.

Figure 6:
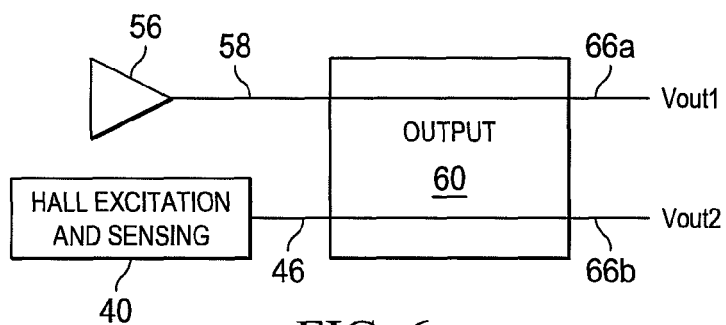
FIG. 6 is a schematic diagram illustrating another output circuit embodiment in the current sensing system, providing separate first and second voltage outputs corresponding to the closed-loop and open-loop sensor circuits.
Figure 7:
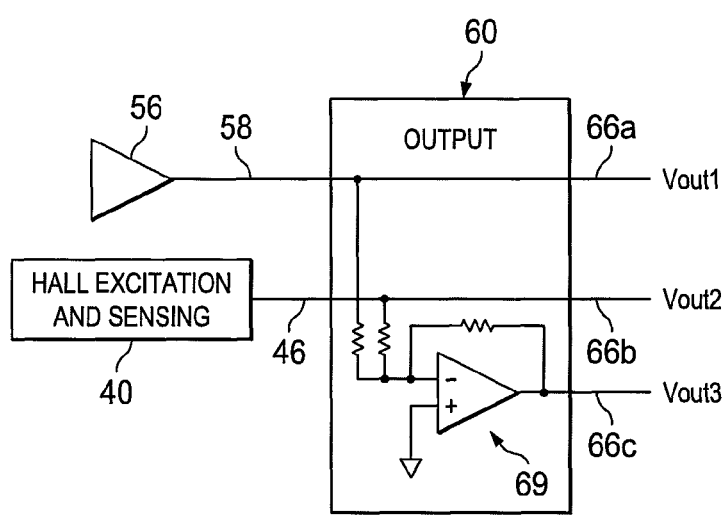
FIG. 7 is a schematic diagram illustrating a further output circuit embodiment including separate outputs corresponding to the closed-loop and open-loop sensor circuits and a combined output.

Referring also to FIGS. 6 and 7, the disclosed hybrid structure 2 also advantageously provides a solution for applications in which it is desirable to provide redundant sensing and the capability for self-testing, for example, to facilitate safe operation of the host system. In the example of FIG. 6, for instance, the output circuitry 60 provides a first output signal 66a representing the first current sensor signal 58, and also provides a second output signal 66b representing the second current sensor signal 46. In this embodiment, for example, the two outputs 66a and 66b each provide an indication of the sensed current within the conductor 4 throughout the entire normal operating range (e.g., 0% through 100%), and thus redundant sensing capability is provided using a single integrated circuit structure 50, at considerably higher power efficiency and lower cost and size than would be the case if multiple magnetic sensors are separately provided in a gap of the core structure 6. In addition, the provision of separate outputs 66a and 66b facilitates the option of self-testing, if desired, for safe reliable operation of the host system.

FIG. 7 shows a further output circuit embodiment 60, also including separate outputs 66a (Vout1) and 66b (Vout2) corresponding respectively to the closed-loop and open-loop sensor circuits, as well as a combined output 66c (Vout3) provided using a summing amplifier circuit 69 to effectively provide the combined output 66c as the sum of the first current sensor signal 58 and the second current sensor signal 46. The summing amplifier circuit 69 may be modified in certain embodiments to adjust the relative summation of the two signals 58 and 46, for example, to accommodate various offsets or gains associated with individual ones of the current sensor signals 58 and 46.

The examples of FIGS. 4-7 are just a few of the possible output circuit configurations 60 which could be employed in the hybrid closed-loop/open-loop integrated current sensing apparatus 2 in accordance with the various aspects of the present disclosure. For example, many different switching circuits could be provided for selectively controlling a single output pin voltage 66 in various operating modes of the apparatus 2, and on-board analog-to-digital converters 68 may be provided in one or more output signal paths. Moreover, the apparatus 2 may include a microprocessor or other programmable or programmed logic to perform various control and/or reporting functions based on converted digital values corresponding to one or both of the signals 58, 46 in certain embodiments. Moreover, analog circuitry may be provided in the output 60 to perform various functions, wherein the summing amplifier circuitry 69 in FIG. 7 is but one example.

Figure 8:
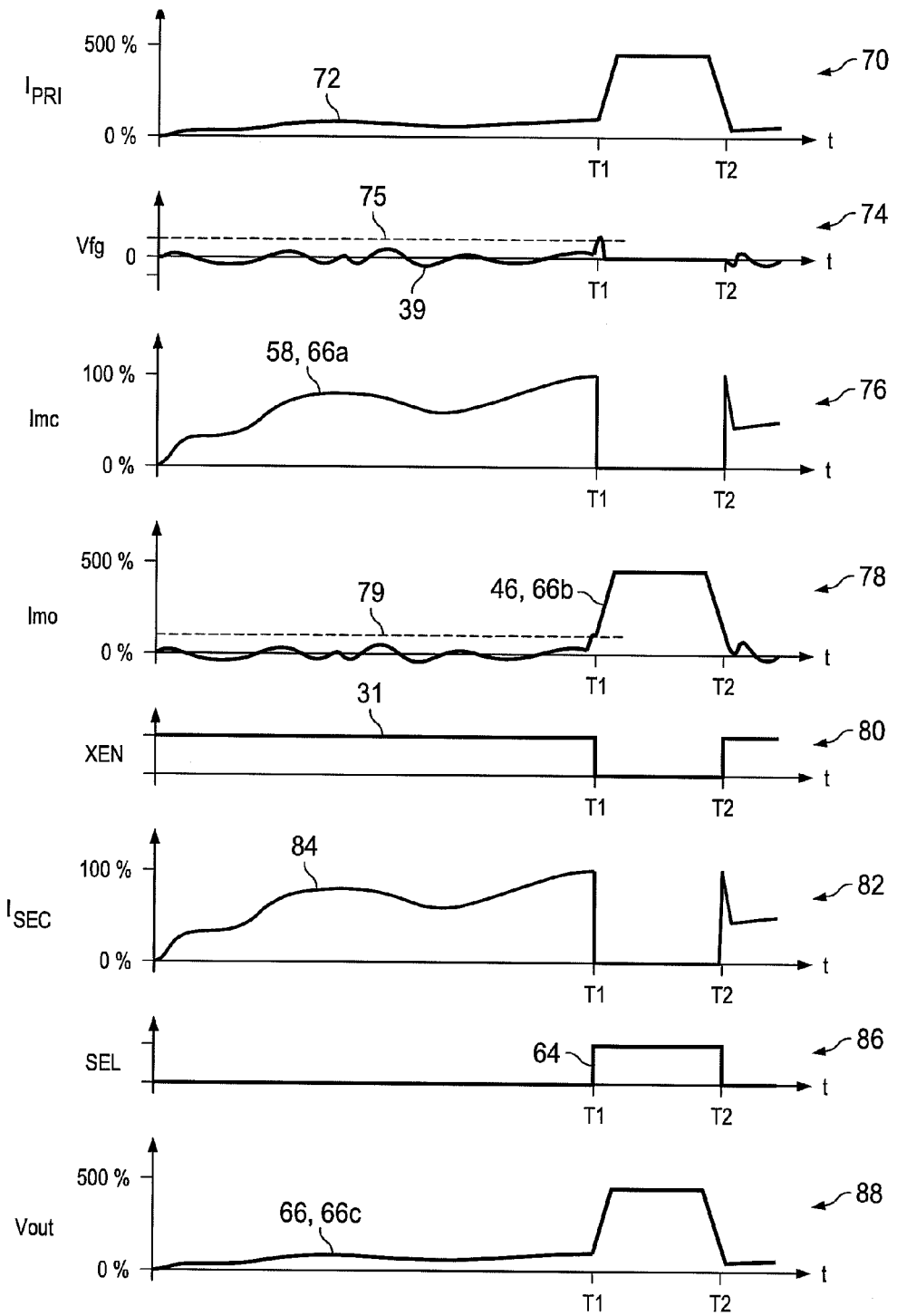
FIG. 8 is a waveform diagram illustrating various electrical signals in the current sensing system of FIG. 1 showing an embodiment in which closed-loop compensation coil driver circuitry is operational in a first current sensing range and is selectively disabled in a second higher current sensing range.

Referring now to FIGS. 1 and 8, waveform diagrams or graphs are shown illustrating exemplary operation of the sensing apparatus 2 in one embodiment in which the logic circuitry 62 detects transition from the nominal current sensing operating range into a higher current (second) operating range through threshold comparison of one or both of the first magnetic sensor output signal 39 from the fluxgate sensing circuitry 30 and/or the second current sensor signal 46 from the hall excitation and sensing circuitry 40. Certain implementations may initiate the operating mode change via the output circuit mode select signal 64, and the logic circuit 62 selectively disables operation of the fluxgate excitation circuit 32 (FIG. 1) via the excitation enable signal 31 according to the operating range of the sensing apparatus 2 in this example. The graph 70 in FIG. 8 illustrates an exemplary primary current signal 72 showing the current $I_{PRI}$ flowing in the conductor 4 of FIG. 1 in operation of the host system over time, with a transition from a first or nominal expected operating range (0%-100%) to a significantly higher current level (e.g., approximately 450% in the illustrated example) beginning at time T1, and returning to the normal operating range at time T2.

FIG. 8 further illustrates a graph 74 showing the first magnetic sensor output signal 39 (e.g., a fluxgate sensor voltage output signal 39 (Vfg)) and a corresponding first threshold 75 (shown in dashed lines form in FIG. 8), with the logic circuit 62 in one embodiment comparing the first sensor output signal 39 with the corresponding first threshold 75 in generally continuous fashion, and actuating transition from a first operating mode to a second operating mode when the signal 39 is greater than or equal to the threshold 75, and operating in the normal (first) operating mode when the signal 39 is below the threshold 75. As seen in the graph 74, moreover, the fluxgate output signal 39 is generally close to 0 due to the closed-loop operation of the driver circuit 54 and the compensation coil 8, with the driver circuitry 54 effectively regulating the flux in the main core 6 such that the sensor signal 39 from the fluxgate sensing circuitry 30 remains close to zero during the normal operating range.

Graph 76 in FIG. 8 further illustrates the first current sensor signal 58 (which is also provided as the first voltage output 66a in the output circuit embodiments of FIGS. 6 and 7), which rises generally in proportion to the corresponding primary current curve 72 until time T1, as well as after time T2 in this example. FIG. 8 further provides a graph 78 illustrating the second current sensor signal 46 (which is also provided as the second output Vout2 66b in the output circuitry embodiments of FIGS. 6 and 7), which shows operation of the Hall sensor in providing an output 46 generally tracking the primary current curve 72 of graph 70, including tracking in the over-current operation from T1 through T2. The graph 78 further illustrates a second threshold 79 (shown in dashed line in the figure) which is set at approximately 100% of the nominal operating range for the apparatus 2, where the logic circuit 62 may compare the second current sensor signal 46 with this second threshold 79 for selective mode switching in certain embodiments.

Referring also to the graphs 80 and 86 of FIG. 8, the logic circuit 62 in this example advantageously compares the current flowing through the conductor 4 by threshold comparison of either the fluxgate output voltage (signal 39 in graph 74) and/or the second current sensor signal 46 (graph 78) with a corresponding threshold 75, 79. In one embodiment, the logic circuit 62 provides the control signal 64 in a first state (e.g., prior to time T1 FIG. 8) to cause the output circuit 62 provide the output signal 66 (e.g., output circuit 60 in FIG. 4 or FIG. 5 above) based on the first current sensor signal 58 when the first magnetic sensor output signal 39 and/or the second current sensor signal 46 is below the corresponding threshold 75, 79. In addition, the logic circuitry 62 in this example provides the control signal 64 in the second state to cause the output circuit 62 provide the output signal 66 at least partially according to the second current sensor signal 46 when the first magnetic sensor output signal 39 or the second current sensor signal 46 are greater than or equal to the corresponding threshold 75, 79. This operation is shown in the graph 86 of FIG. 8, in which the logic circuit 62 asserts the output circuit select signal 64 at time T1 (switching the output 66 to track the second current sensor signal 46), and then reverts back to using the first current sensor signal 58 at T2.

As further seen in the graph 80, moreover, the logic circuit 62 in certain embodiments enables the fluxgate excitation circuitry via the enable signal 31 (e.g., allowing the control circuit 34 in FIG. 2 to operate the H bridge excitation circuit 32) while the primary current is within the first or normal operating range, and once the signal 39 meets or exceeds the threshold 75 (or the signal 46 meets or exceeds the threshold 79), the logic circuitry 62 disables operation of the fluxgate excitation circuitry 32, with the enable signal 31 going low at time T1 in the example of FIG. 8. Once the sensed current drops again into the primary sensing range, the logic circuitry 62 again asserts the fluxgate enable signal 31 at time T2 as shown in the graph 80 of FIG. 8. In this example, therefore, the contribution of the first magnetic sensor output signal 39 to the magnetic condition of the sensing court structure 6 is turned off such that this contribution will not offset or disturb the measurement provided by the Hall sensing system 20, 40 in the second range of operation of the hybrid current sensing apparatus 2. This is seen in graph 82 of FIG. 8, showing a curve 84 illustrating the secondary current flow $I_{SEC}$ through the compensation coil 8, which generally tracks the profile of the primary current flow curve 72 of graph 70 until the fluxgate excitation is turned off at T1, and then resumes tracking the primary current after T2.

Graph 88 in FIG. 8 illustrates the final output voltage (66 in the example of FIG. 4), where the overall output of the apparatus 2 generally tracks the primary current curve 72 of graph 70, due to the selective operation of the logic circuitry 62 and the provision of two separate sensors in the integrated circuit structure 50. Thus, the apparatus 2 provides an accurate indication of the level of current flow through the primary conductor 4 even during the time period T1-T2 during which the primary current exceeds the normal operating range.

Figure 9:
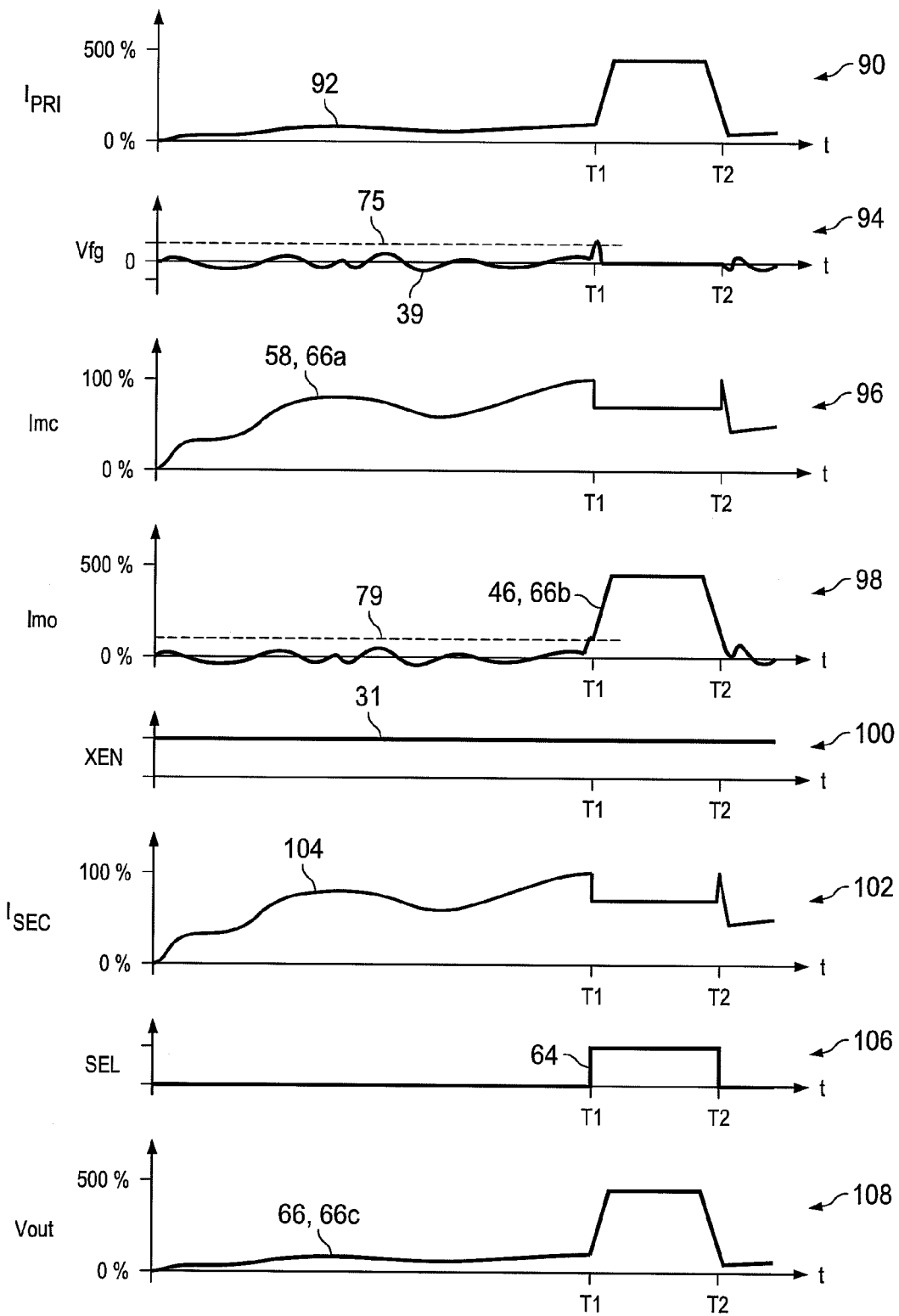
FIG. 9 is a waveform diagram illustrating electrical signals in another embodiment of the current sensing apparatus in which the compensation coil driver circuitry provides a fixed level of compensation coil excitation in the second higher current sensing range.

Referring also to FIG. 9, further graphs 90, 94, 96, 98, 100, 102, 106 and 108 illustrate system signals in operation according to a similar primary current profile curve 92 (graph 90) in which the driver circuit 54 is operative in a first mode to provide the compensation signal (104 in graph 102) at a level representing the primary current flowing in the conductor 4 to regulate the flux density in the closed-loop magnetic circuit to a constant level over at least a portion of the first current range. The driver 54 then provides the compensation signal $I_{SEC}$ at a second constant level (e.g., approximately 70% in this example) over the second current range, with the logic circuit 62 in this case maintaining the fluxgate excitation circuit in the enabled mode (excitation enable signal 31 shown in graph 100) throughout operation of the system 2. In this manner, the first current sensor signal 58 shown in graph 96 of FIG. 9 generally tracks the primary current curve 92 of graph 90 until T1, and then reverts to a corresponding constant level (e.g., 70% in this case) from T1 through T2. The provision of this constant compensation signal may be accomplished in certain embodiments by the logic circuit 62 setting operation of the control circuit 34 to provide a constant pulse width modulated excitation signal via switching control signals provided to the H-bridge circuit 32 in FIG. 2. At T2, in this example, the logic circuit 62 switches again to the first operating mode, with the driver 56 again providing the compensation signal level 104 ($I_{SEC}$) which generally tracks the primary current after T2 due to the closed-loop operation. As seen in the graph 106 of FIG. 9, the output select control signal 64 is again asserted by the logic circuitry 62 at T1 and then discontinued at T2 based on the threshold comparison of signal 39 or signal 46, and the graph 108 illustrates the single output 66 (based on the switched selection in the example of FIGS. 4 and 5) as well as the exemplary combined output 66c (from the summation circuitry 69 in the example of FIG. 7), which track the sensed primary current curve 92 of graph 90.

As seen above, therefore, the apparatus provides an integrated dual-sensor solution by which an extended operating range is achieved without requiring the driver circuit 54 and the fluxgate sensor circuitry 10, 30 to be designed for the higher second current range, while advantageously providing the accuracy benefits of the closed-loop sensing operation during the normal expected operating range with the ability to provide a current sensing output signal representing the primary current flow through the conductor 4 during overcurrent conditions. In this regard, the various concepts of the present disclosure are not limited to embodiments using fluxgate sensors 10 or Hall secondary sensors 20, although these particular configurations are advantageous in certain respects. For instance, Hall sensors are easily integrated into the fabrication of the integrated circuit structure 50, and vertical Hall sensors may be constructed for magnetic sensitivity along the plane of the integrated circuit side 50a, thereby being sensitive in the same direction as the fluxgate sensor 10. This facilitates easy mounting within a gap of the current sensing core structure 6, for example, as seen in FIGS. 1 and 3 above.

Moreover, Hall sensors can provide generally linear operation to yield adequate current sensor output signals at significantly high values, for example, where the secondary sensor 20 can be constructed to produce fairly accurate signals in a second range that significantly exceeds the highest value of the first sensing range. Thus, while the examples illustrated above describe a second operating range from approximately 100% through approximately 500% of a nominal first operating range, other embodiments are possible in which the secondary sensor 20 and associated excitation and sensing circuitry 40 may provide a suitable output 66 at significant multiples of the first operating range, including without limitation 1000% in certain implementations. This provides a significant solution for many applications in which the safe measurement of large currents is needed in a normal operating range, with the fluxgate system 10, 30, 54, 56 providing the ability to accurately measure a certain nominal current, (e.g., 50 A) with a total error of 0.1% or less, and with the Hall sensor circuitry 20, 40 providing the ability to measure an overload current of up to 5-10 times the nominal current (e.g., 250-500 A), albeit with a reduced accuracy (e.g., 3-5%). Moreover, the disclosed sensing apparatus 2 advantageously facilitates provision of a second separate measurement path for redundancy, which is particularly useful in safety-critical applications, for example, as shown in FIGS. 6 and 7 above. This, in turn, provides a solution for current measurement applications in which redundancy and/or self-testing is desirable to facilitate correct measurement of a sensed current, without requiring the added cost, complexity, and power consumption associated with use of two current sensors in parallel.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. An apparatus for sensing a current flowing in a conductor, comprising:
   an integrated circuit structure with a first side;
   a first current sensing circuit, including:
      a first magnetic sensor formed as part of the integrated circuit structure and operative to provide a first magnetic sensor output signal according to a magnetic field in a first direction generally parallel to the first side of the integrated circuit structure,
      a driver circuit operative to provide a compensation signal in a closed-loop magnetic circuit to drive a compensation coil for excitation of a core structure magnetically affected by the current flowing in the conductor at least partially according to the first magnetic sensor output signal, and
      a compensation sensing circuit formed as part of the integrated circuit structure and operative to provide a first current sensor signal at least partially according to the compensation signal from the driver circuit;
   a second current sensing circuit including a second magnetic sensor formed as part of the integrated circuit structure and operative to provide a second current sensor signal at least partially according to the magnetic field in the first direction; and
   an output circuit operative to provide at least one output signal representing the current flowing in the conductor according to the first current sensor signal over at least a portion of a first current range of the current flowing in the conductor and further representing the current flowing in the conductor according to the second current sensor signal over a second current range of the current flowing in the conductor, wherein a maximum value of the second current range is outside the first current range.

2. The apparatus of claim 1, wherein the driver circuit is operative in a first mode to provide the compensation signal at a level representative of the current flowing in the conductor to regulate a flux density in the closed-loop magnetic circuit to a constant level over at least a portion of the first current range of the current flowing in the conductor.

3. The apparatus of claim 2, wherein the driver circuit is operative to discontinue providing the compensation signal in a second mode over the second current range of the current flowing in the conductor.

4. The apparatus of claim 2, wherein the driver circuit is operative to provide the compensation signal at a constant level in a second mode over the second current range of the current flowing in the conductor.

5. The apparatus of claim 2, wherein the second current sensor signal is representative of the magnetic field in the first direction over the second current range of the current flowing in the conductor.

6. The apparatus of claim 2, wherein the at least one output signal includes a first output signal representative of the first current sensor signal and a second output signal representative of the second current sensor signal.

7. The apparatus of claim 2, wherein the output circuit is operative to provide a sum of the first current sensor signal and the second current sensor signal.

8. The apparatus of claim 2, wherein the first magnetic sensor is a fluxgate sensor.

9. The apparatus of claim 8, wherein the second magnetic sensor is a Hall sensor.

10. The apparatus of claim 2, wherein the second magnetic sensor is a Hall sensor.

11. The apparatus of claim 1, wherein the first magnetic sensor is a fluxgate sensor.

12. The apparatus of claim 11, wherein the second magnetic sensor is a Hall sensor.

13. The apparatus of claim 1, wherein the second magnetic sensor is a Hall sensor.

14. The apparatus of claim 1, further comprising a logic circuit operative to compare at least one of the first magnetic sensor output signal and the second current sensor signal with a threshold, to provide a control signal in a first state to cause the output circuit to provide the at least one output signal based on the first current sensor signal when the at least one of the first magnetic sensor output signal and the second current sensor signal is below the threshold, and to provide the control signal in a second state to cause the output circuit to provide the at least one output signal at least partially according to the second current sensor signal when the at least one of the first magnetic sensor output signal and the second current sensor signal is greater than or equal to the threshold.

15. An apparatus for sensing a current flowing in a conductor, comprising:
a first current sensing circuit, including:
a fluxgate sensor circuit operative to provide a first magnetic sensor output signal according to a magnetic field in a first direction,
a driver circuit operative to provide a compensation signal in a closed-loop magnetic circuit to drive a compensation coil for excitation of a core structure magnetically affected by the current flowing in the conductor at least partially according to the first magnetic sensor output signal, and
a compensation sensing circuit operative to provide a first current sensor signal at least partially according to the compensation signal from the driver circuit;
a Hall sensor operative to provide a second current sensor signal at least partially according to the magnetic field in the first direction; and
an output circuit operative to provide at least one output signal representing the current flowing in the conductor according to the first current sensor signal over at least a portion of a first current range of the current flowing in the conductor and further representing the current flowing in the conductor according to the second current sensor signal over a second current range of the current flowing in the conductor, wherein a maximum value of the second current range is outside the first current range.

16. The apparatus of claim 15, wherein the at least one output signal includes a first output signal representative of the first current sensor signal and a separate second output signal representative of the second current sensor signal.

17. The apparatus of claim 15, wherein the output circuit is operative to provide a sum of the first current sensor signal and the second current sensor signal.

18. A hybrid closed-loop, open-loop magnetic current sensor, comprising:
a magnetically susceptible core structure with an opening to accommodate an electrical conductor conducting a current to magnetically interact with the core structure;
a compensation coil having at least one winding around a portion of the core structure; and
an integrated circuit positioned at least partially within a gap of the core structure and connected to the compensation coil, the integrated circuit comprising means for testing the current flowing in the electrical conductor using a closed-loop magnetic circuit comprising a first sensor formed on or in the integrated circuit within the gap of the core structure, and means for testing the current flowing in the electrical conductor using an open-loop magnetic circuit comprising a second sensor formed on or in the integrated circuit within the gap of the core structure, wherein the integrated circuit includes:
a first current sensing circuit formed on or in the integrated circuit and including:
a fluxgate sensor circuit providing a first magnetic sensor output signal according to a magnetic field in a first direction within the gap of the core structure,
a driver circuit coupled to provide a compensation signal in the closed-loop magnetic circuit to drive the compensation coil for excitation of the core at least partially according to the first magnetic sensor output signal, and
a compensation sensing circuit operative to provide a first current sensor signal at least partially according to the compensation signal from the driver circuit;
a Hall sensor formed on or in the integrated circuit and providing a second current sensor signal at least partially according to the magnetic field in the first direction within the gap of the core structure; and
an output circuit operative to provide at least one output signal representing the current flowing in the conductor according to the first current sensor signal over at least a portion of a first current range of the current flowing in the conductor and further representing the current flowing in the conductor at least partially according to the second current sensor signal over a second current range of the current flowing in the conductor, wherein a maximum value of the second current range is outside the first current range.

* * * * *